United States Patent
Khurana et al.

(10) Patent No.: US 7,522,439 B2
(45) Date of Patent: Apr. 21, 2009

(54) LOW POWER CONTENT ADDRESSABLE MEMORY SYSTEM AND METHOD

(75) Inventors: Anoop Khurana, New Delhi (IN); Rajiv Kumar, Noida (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 283 days.

(21) Appl. No.: 11/321,749

(22) Filed: Dec. 29, 2005

(65) Prior Publication Data

US 2006/0171184 A1 Aug. 3, 2006

(30) Foreign Application Priority Data

Dec. 29, 2004 (IN) .................................. 2593/2004

(51) Int. Cl.
*G11C 15/00* (2006.01)
(52) U.S. Cl. ................. 365/49.17; 365/49.1; 365/49.18
(58) Field of Classification Search ................... 365/49, 365/189.07, 189.08, 49.1, 49.17, 49.18
See application file for complete search history.

(56) References Cited

U.S. PATENT DOCUMENTS

| | | | |
|---|---|---|---|
| 6,191,969 B1 * | 2/2001 | Pereira | 365/49.12 |
| 6,229,742 B1 * | 5/2001 | Srinivasan et al. | 365/200 |
| 6,262,929 B1 * | 7/2001 | Miyatake et al. | 365/203 |
| 6,275,426 B1 * | 8/2001 | Srinivasan et al. | 365/200 |
| 6,597,595 B1 * | 7/2003 | Ichiriu et al. | 365/49 |
| 6,804,133 B1 * | 10/2004 | Khanna | 365/49 |

* cited by examiner

*Primary Examiner*—Richard Elms
*Assistant Examiner*—Hien N Nguyen
(74) *Attorney, Agent, or Firm*—Lisa K. Jorgensen; Paul F. Rusyn; Graybeal Jackson Haley LLP

(57) ABSTRACT

A low power content addressable memory system comprising an array of content addressable memory cells organized as a plurality of equal sized CAM cell groups, each CAM cell group having one or more CAM cells; a valid entry tag bit associated with each said content addressable memory cell; a match output generator connected to the output of each CAM cell and an enabling means having its first input connected to the valid entry tag bit, its second input connected to a match control signal and its output connected to the corresponding match output generator such that said match output generator is enabled only if said valid entry tag bit indicates a valid entry.

18 Claims, 3 Drawing Sheets

LOW POWER CONTENT ADDRESSABLE MEMORY SYSTEM AND METHOD

PRIORITY CLAIM

This application claims priority from Indian patent application No. 2593/Del/2004, filed Dec. 29, 2004, which is incorporated herein by reference.

TECHNICAL FIELD

Embodiments of the present invention provide low power content addressable memory system by restricting searches to valid entries.

BACKGROUND

High densities CAMs (Content Addressable Memory) are most widely used for IP lookup-/-packet classifications operations in routers. The CAM circuits consume a good amount of power during lookup operations.

FIG. 1 shows the search operation for a conventional high density CAM. For example, if the size of memory is M words for each of N bits and number of match lines is M then all the M match lines are precharged to vdd-vt through a PRCH_signal. In the worst case, if there is no data match or a hit condition, all the match lines would discharge. If average discharge current through one match line is $I_{Match}$ then the worst case discharge current is $M \times I_{match}$, which takes a heavy toll on the power consumption of the content addressable memory circuit, wherein the searching of each data word takes into account searching through individual CAM cells. However, if a status of validity or invalidity is set for a given word then charging and discharging processes can be avoided for the invalid words in the memory cell.

Thus, a need is felt for a high-density content addressable memory circuit array, which would charge/discharge only for the valid word match lines.

SUMMARY

Embodiments of the instant invention provide a low power content addressable memories by restricting the search for only valid entries.

Another embodiment of the invention avoids precharging during the subsequent lookups as discharging of match lines for invalid entries during search operation is not required.

According to one embodiment of the present invention, a low power content addressable memory system includes an array of content addressable memory cells organized as a plurality of equal sized CAM cell groups, each CAM cell group having one or more CAM cells. A valid entry tag bit is associated with each said content addressable memory cell. A match output generator is connected to the output of each CAM cell. An enabling means has its first input connected to the valid entry tag bit, its second input connected to a match control signal and its output connected to the corresponding match output generator such that said match output generator is enabled only if said valid entry tag bit indicates a valid entry.

According to one embodiment of the present invention, power reduction is accomplished by testing the validity of each CAM cell and thereby testing the validity of the entire data word.

BRIEF DESCRIPTION OF THE DRAWINGS

Embodiments of the invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
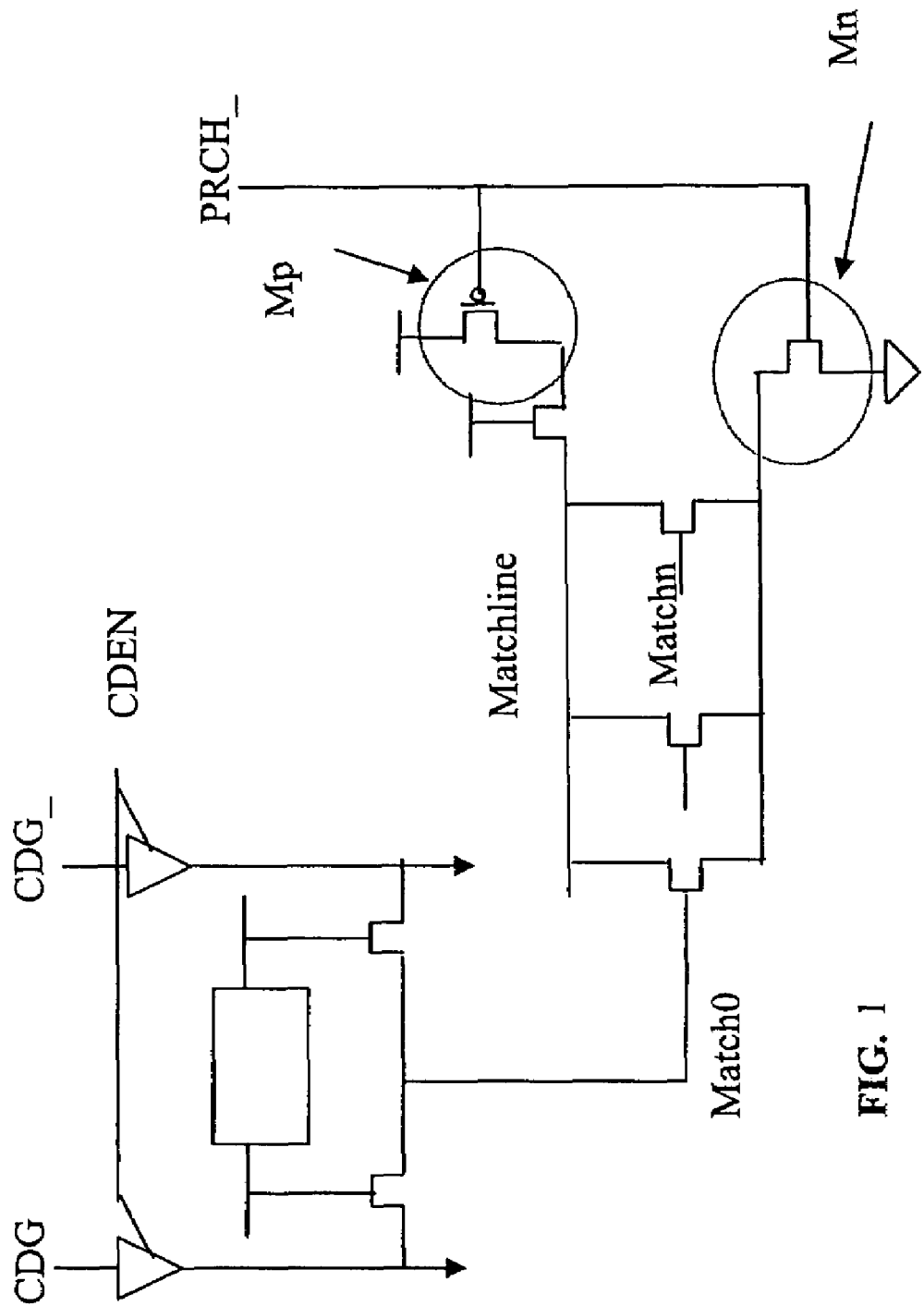
FIG. 1 shows a conventional content addressable memory cell.
Figure 2:
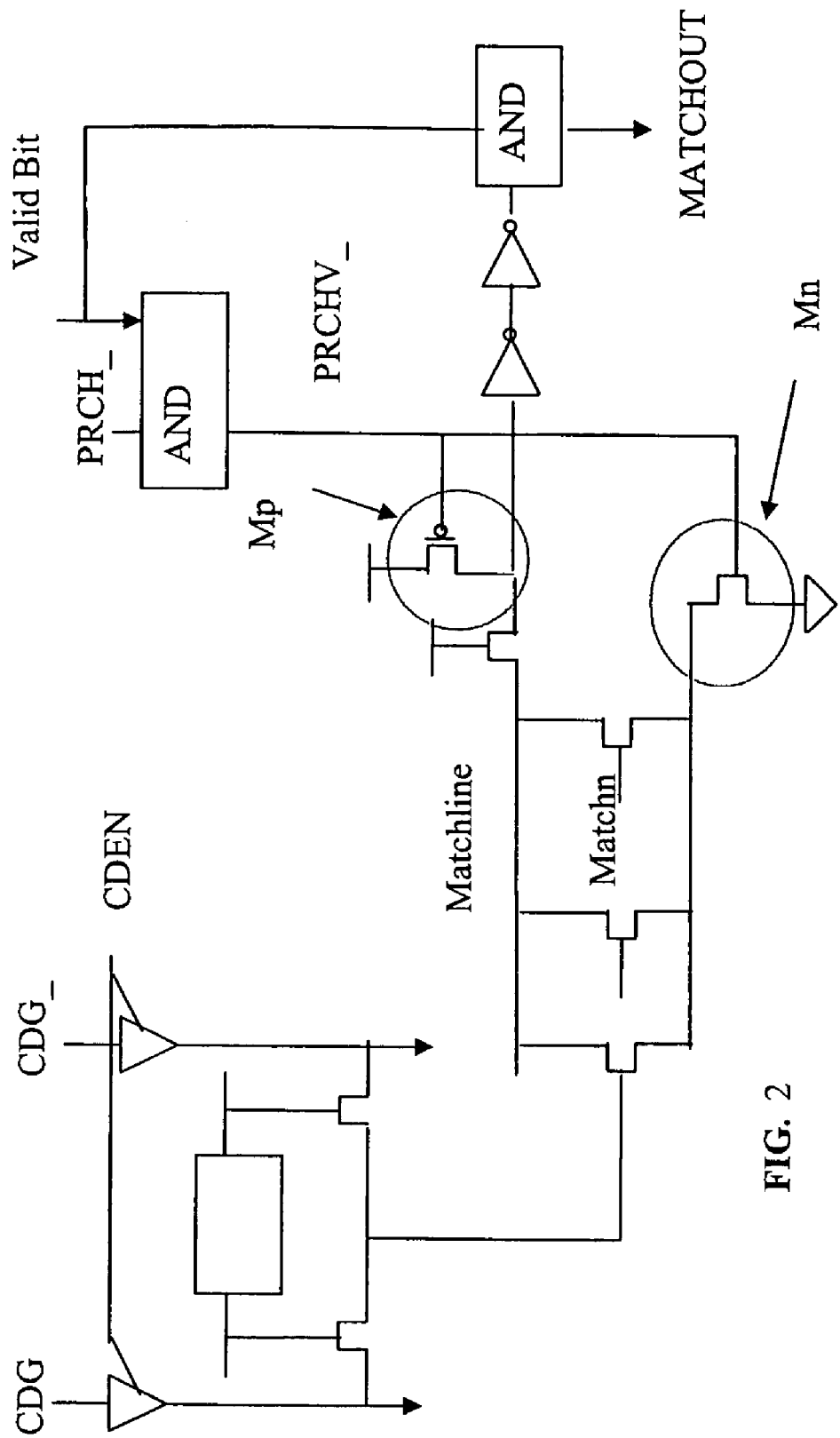
FIG. 2 illustrates a low power content addressable memory cell in accordance with one embodiment of the present invention.

FIG. 2 shows a CAM cell storing a tag bit with each word. If this bit is set, it indicates that the word is a valid entry else it is not a valid entry. The valid bit is logically ANDed with the PRCH_signal by using the logic and gate AND, to thereby enable the bit match operation and is then applied at the gates of the PMOS Mp and NMOS Mn. For a given word, if the valid bit is set then only match line evaluation of that particular word is of any significance. However, if the valid bit is assigned a zero value or it is not set, then the match lines for all the words in the CAM cell array will always remain precharged, which eventually saves power by avoiding invalid charging and discharging of the match lines. The CAM cell of FIG. 2 is typically contained in an array of such CAM cells, with the array in turn being contained within a CAM memory device, such as the CAM memory device disclosed in U.S. Pat. No. 6,978,343 B1, which is incorporated herein by reference.

For a given CAM size of M words, if M/2 entries are the only valid entries then a search operation is performed only for these entries and thus it results in low power consumption of the content addressable memory cell array.

The valid bit is also logically ANDed with a match line sense amplifier output, wherein the match line sense amplifier has a cascade structure of two logic inverters. If both the valid bit and the sense amplifier output are set then MATCHOUT, which is the output of the sense amplifier, will be set for indicating a hit, and otherwise MATCHOUT indicates an invalid entry.

Thus, the matching circuitry undergoes a logic enablement operation through the circuitry provided by the logic and gates in the CAM circuits.

Figure 3:
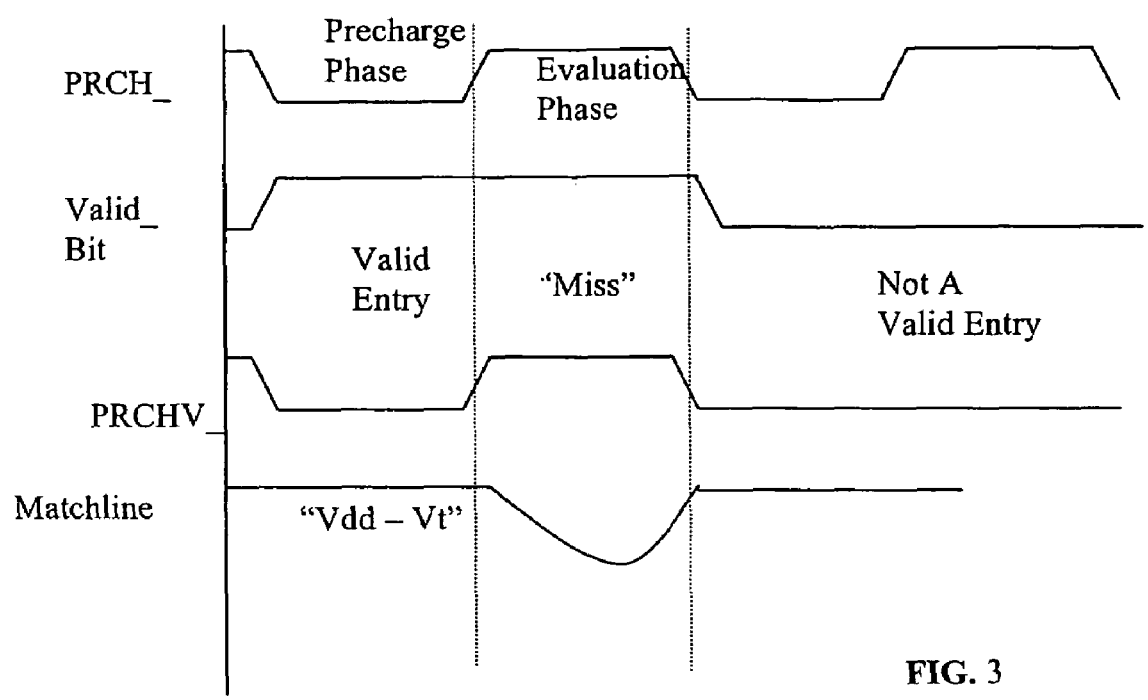
FIG. 3 illustrates the waveforms at different nodes of the content addressable memory in accordance with one embodiment of the present invention.

FIG. 3 shows the waveforms at different nodes of the content addressable memory cell shown in FIG. 2, during precharge and evaluation phase of valid and not a valid entry. It shows the logic level of PRCH, valid bit, PRCHV and match line during the precharge and evaluation phase, which clearly depicts that the match and mismatch mode operations are enabled for the valid bit being set to a logic high value.

The CAM memory cells as described herein can be utilized in CAM memory devices that are contained in a variety of different types of electronic systems, such as in network switches and routers.

From the foregoing it will be appreciated that, although specific embodiments of the invention have been described herein for purposes of illustration, various modifications may be made without deviating from the spirit and scope of the invention.

We claim:

1. A low power content addressable memory system, comprising:
   a. an array of content addressable memory cells organized as a plurality of equal sized CAM cell groups, each CAM cell group having one or more CAM cells;
   b. a valid entry tag bit associated with each said content addressable memory cell;
   c. a match output generator connected to the output of each CAM cell; and
   d. an enabling means having its first input connected to the valid entry tag bit, its second input connected to a match control signal and its output connected to the corresponding match output generator such that said match output generator is enabled only if said valid entry tag bit indicates a valid entry.

2. A low power content addressable memory system as claimed in claim 1, wherein said CAM cell comprising:
   a. a transistorized circuit for data storage; and
   b. a connecting means coupled to the output of said transistorized circuit for generating a match or mismatch status output.

3. A low power content addressable memory system as claimed in claim 2, wherein said match output generator comprising:
   a. a match line connected to first terminal of said connecting means;
   b. a first charging means connected to second terminal of said connecting means; and
   c. a second charging means connected to said match line for controlling charge sharing between said match control signal and match line.

4. A low power content addressable memory system as claimed in claim 1, wherein said enabling means comprising:
   a. a first logic gate connected to said match control signal at its first input and to the valid entry tag bit;
   b. at least two logic inverters cascaded to each other and receiving a signal from said match output generator for generating a match or mismatch status; and
   c. a second logic gate connected to the valid entry tag bit at its first input and connected to the output of said logic inverters for generating match or mismatch output.

5. A low power content addressable memory system as claimed in claim 4, wherein said first and second logic gate is a logic and gate.

6. A low power content addressable memory system as claimed in claim 2, wherein said connecting means is a transistor.

7. A low power content addressable memory system as claimed in claim 3, wherein said first charging means is a transistor.

8. A low power content addressable memory system as claimed in claim 3, wherein said second charging means comprising:
   a. a first transistor coupled to said match line at its input and connected to a higher voltage supply at its control terminal; and
   b. a second transistor coupled at its input to a higher voltage supply and coupled to the output of said first transistor and receiving the output from said enabling means at its control terminal.

9. A content addressable memory system, comprising:
   an array of content addressable memory cells;
   a match output generator coupled to the output of each CAM cell;
   an enabling circuit coupled to the match output generator and adapted to receive a valid entry tag signal that is associated with each content addressable memory cell and is adapted to receive a match control signal, the enabling circuit operable to enable the match output generator responsive to the valid entry tag signal being active and operable to disable the match output generator responsive to the valid entry tag signal being inactive.

10. The content addressable memory system of claim 9 wherein the array of content addressable memory cells comprises a plurality of equal sized content addressable memory cell groups, each group including one or more memory cell.

11. The content addressable memory system of claim 9 wherein each content addressable memory cell comprises:
    a transistorized circuit for data storage; and
    a connecting circuit coupled to the output of the transistorized circuit and operable to generate a match or mismatch status signal.

12. The content addressable memory system of claim 9 wherein the match output generator comprises:
    a match line coupled to a first node of the connecting circuit;
    a first charging circuit coupled to a second node of the connecting circuit; and
    a second charging circuit coupled to the match line and operable to control charge sharing between the match control signal and the match line.

13. The content addressable memory system of claim 12 wherein the first and second charging circuits each comprise a transistor.

14. The content addressable memory of claim 9 wherein the enabling circuit comprises:
    a first logic gate adapted to receive the match control signal and the valid entry tag signal on respective inputs;
    a logic circuit coupled to receive a signal from the match output generator and operable to generate a match status signal responsive to the signal from the match output generator; and
    a second logic gate adapted to receive the valid entry tag signal and coupled to receive the match status signal from the logic circuit and operable to generate a match output signal responsive to the valid entry tag signal and the match status signal.

15. A method of accessing content addressable memory cells, each memory cell having an associated match line and the method comprising:
    generating a valid bit signal indicating whether data stored in a given memory cell corresponds to a bit in an applied data word; and
    controlling precharging of the match lines associated with the memory cells as a function of the valid bit signal, wherein the operation of controlling comprises disabling the discharge of precharged match lines for memory cells for which the associated valid bit signal is inactive.

16. The method of claim 15 wherein the operation of controlling further comprises precharging the match lines only when the valid bit signal is active.

17. The method of claim 16 wherein the valid bit signal is active only when a corresponding bit or bits in the data word corresponds to data stored in a corresponding memory cell.

18. The method of claim 17 wherein the valid bit signal is a logic level signal that is set to high level when active and a low level when inactive.

* * * * *